United States Patent [19]
Carlsten et al.

[11] Patent Number: 5,714,913
[45] Date of Patent: Feb. 3, 1998

[54] DISCRETE MONOTRON OSCILLATOR HAVING ONE-HALF WAVELENGTH COAXIAL RESONATOR WITH ONE-QUARTER WAVELENGTH GAP SPACING

[75] Inventors: Bruce E. Carlsten; William B. Haynes, both of Los Alamos, N. Mex.

[73] Assignee: The Regents of the University of California, Oakland, Calif.

[21] Appl. No.: 569,628

[22] Filed: Dec. 8, 1995

[51] Int. Cl.⁶ .................... H03B 9/01; H01J 25/06
[52] U.S. Cl. .................... 331/81; 331/97; 331/101; 331/103; 315/5; 315/5.51
[58] Field of Search .................... 315/4, 5, 5.51; 331/79, 81, 97, 101, 103

[56] References Cited

U.S. PATENT DOCUMENTS

| | | | |
|---|---|---|---|
| 2,263,648 | 11/1941 | Salzberg | 315/5 X |
| 2,405,612 | 8/1946 | Schelkunoff | 333/227 |
| 2,408,409 | 10/1946 | Bowen | 315/5.51 X |
| 2,425,352 | 8/1947 | Sloss | 331/97 |
| 4,398,121 | 8/1983 | Chodorow et al. | 315/4 |
| 4,531,103 | 7/1985 | Evans et al. | 331/83 |
| 4,825,441 | 4/1989 | Marshall et al. | 372/2 |

FOREIGN PATENT DOCUMENTS

| 472598 | 8/1976 | U.S.S.R. | 315/5 |
|---|---|---|---|

OTHER PUBLICATIONS

Jess Marcum, "Contributed Original Research," J. of Appl. Phys. 17, pp. 4–11 (Jan. 1946).

M. Friedman et al., "Self–Modulation Of An Intense Relativistic Electron Beam," J. Appl. Phys. 56 (9), pp., 2459–2474 (Nov. 1984).

Thomas J. T. Kwan et al., "Electron–Beam–Breakup Transit–Time Oscillator," 24 Am. Phys. Soc. vol. 66, pp. 3221–3224 (Jun. 1991).

Barry M. Marder et al., "The Split–Cavity Oscillator: A High–Power E–Beam Modulator And Microwave Source," 3 IEEE Trans. Plasma Phys. vol. 2, pp. 312–331 (Jun. 1992).

*Primary Examiner*—Benny T. Lee
*Attorney, Agent, or Firm*—Ray G. Wilson

[57] ABSTRACT

A discrete monotron oscillator for use in a high power microwave device is formed with a microwave oscillator having a half-wavelength resonant coaxial microwave cavity operating in fundamental TEM mode for microwave oscillation with an inner conductor defining a drift tube for propagating an electron beam and an outer conductor coaxial with the inner conductor. The inner conductor defines a modulating gap and an extraction gap downstream of the modulating gap. The modulating gap and the extraction gap connect the coaxial microwave cavity with the drift tube so that energy for the microwave oscillation is extracted from the electron beam at the extraction gap and modulates the electron beam at the modulating gap. For high power operation, an annular electron beam is used.

7 Claims, 5 Drawing Sheets

DISCRETE MONOTRON OSCILLATOR HAVING ONE-HALF WAVELENGTH COAXIAL RESONATOR WITH ONE-QUARTER WAVELENGTH GAP SPACING

BACKGROUND OF THE INVENTION

This invention relates to microwave generators, and, more particularly, to high power microwave generators converting electron beam energy to microwave energy. This invention was made with government support under Contract No. W-7405-ENG-36 awarded by the U.S. Department of Energy. The government has certain rights in the invention.

There has been a continuing evolution in the performance of microwave devices to higher power, higher efficiencies, and higher frequencies to meet the expanding needs of military and civilian applications. However, the power levels demanded of microwave tubes by many of the emerging applications are several orders of magnitude beyond the capabilities of existing devices.

One example of an emerging industrial use is a high-power, continuous or pulsed microwave source for heating, drying, and catalyzing chemical reactions. The use of microwave energy has several advantages: rapid energy deposition, efficient volume heating, absence of thermal inertia, and the ability to greatly accelerate and selectively induce catalytic chemical reactions. Catalytic techniques have applications that lower the cost of separating mixed chemical and radioactive waste and efficiently removing nitrogen oxides and sulfur dioxides from flue stacks. Catalytic processes also allow the reduction of bulk material temperature by hundreds of degrees centigrade, allowing reactions to proceed at near ambient temperature; the reactions can also occur at near atmospheric pressure rather than several atmospheres of pressure.

Various high-power oscillators have been investigated, including the split-cavity oscillator (B. M. Marder et al., "The split-cavity oscillator: a high-power e-beam modulator and microwave source," 20 IEEE Trans. Plasma Sci. 312 (1992)), the electron-beam transit-time oscillator (BTO) (T. J. Kwan et al., "Electron-beam-breakup transit-time oscillator," 66 Phys. Rev. Lett. 3221 (1991)); and the relativistic klystron oscillator (M. Friedman et al., 56 J. Appl. Phys. 2459 (1984)). The split-cavity oscillator produces a well modulated electron beam (100% harmonic content), but an additional structure is required downstream to extract power. Because of the high energy spread of the bunched beam, only modest electron-energy to radio frequency (rf) energy conversion efficiencies (less than 30%) are possible without the additional complexity of post-acceleration.

The BTO does not depend on axial bunching to facilitate energy exchange, but induces transverse deflection of an electron beam to increase energy exchange with a surrounding electromagnetic field (emf) in the $TM_{110}$ mode. Power can be extracted directly from the BTO, but the mode has to be converted before use. The device has about twice the efficiency of a continuous conventional monotron (about 35%), but requires high diode voltage as the beam power is increased because of the potential energy requirements of the beam in the significantly larger resonator. This effect limits the efficiency of the device. The large diode voltages (probably>1 MV for beam currents of 2 kA or more) present practical difficulties.

Mildly relativistic ($\gamma<2$) intense-beam (5 kA) klystron amplifiers have demonstrated high efficiencies (around 40%), but typically require three cavities separated by long lengths (which scale as $\gamma^2\beta^2$ where $\gamma$ is the relativistic mass factor $(1-\beta^2)$ and $\beta$ is the relativistic electron beam velocity relative to the speed of light) and an input drive signal of several hundred kilowatts. Self-excited relativistic klystron oscillators can be made that do not require an input signal by increasing the current and, thus, the concomitant space-charge depression. A virtual cathode can be formed in the output cavity, returning electrons to modulate the earlier gain cavities. These devices, however, have only extremely low efficiencies because microwave power can only be extracted from the kinetic energy of the beam in the output cavity.

These problems of the prior art are addressed by the present invention and an improved monotron is presented for high-power microwave generation.

It is an object of the present invention to provide a simple microwave oscillator.

It is another object of the present invention to provide a microwave oscillator having a relatively high efficiency for converting electron beam energy to microwave energy.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise a microwave oscillator having a half-wavelength resonant coaxial microwave cavity operating in fundamental TEM mode for microwave oscillation with an inner conductor defining a drift tube for propagating an electron beam and an outer conductor coaxial with the inner conductor. The inner conductor defines a modulating gap and an extraction gap downstream of the modulating gap. The modulating gap and the extraction gap connect the coaxial microwave cavity with the drift tube so that energy for the microwave oscillation is extracted from the electron beam at the extraction gap and modulates the electron beam at the modulating gap.

In one embodiment, the modulating gap and the extraction gap are symmetrically located relative to the half-wavelength coaxial cavity. In another embodiment the modulating gap and the extraction gap are spaced a quarter-wavelength apart along the half-wavelength cavity. In yet another embodiment, the modulating gap and the extraction gap have the same lengths. At least one quarter-wavelength section may be located at the output of the half-wavelength microwave section for attenuating undesired microwave propagation modes.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1A:
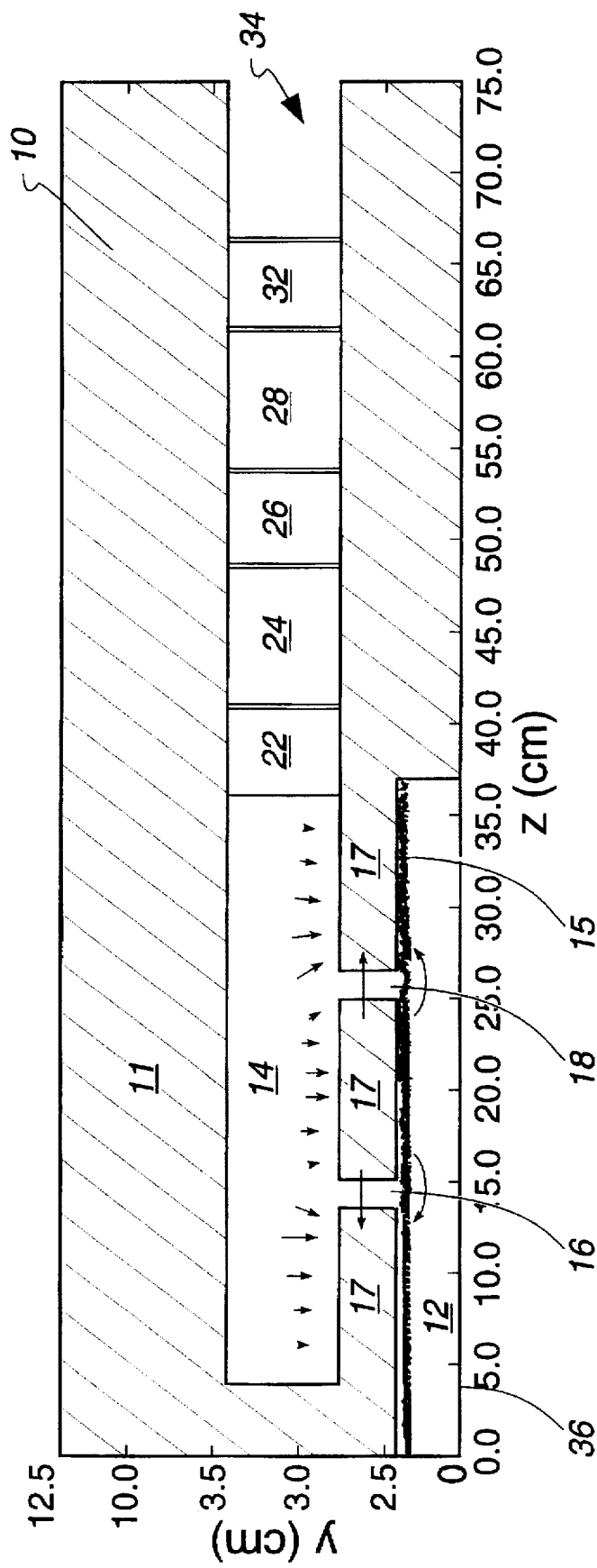
FIG. 1A depicts a DMO configuration used for simulating DMO performance according to the present invention using quarter-wave dielectric plates for frequency selection.
Figure 1B:
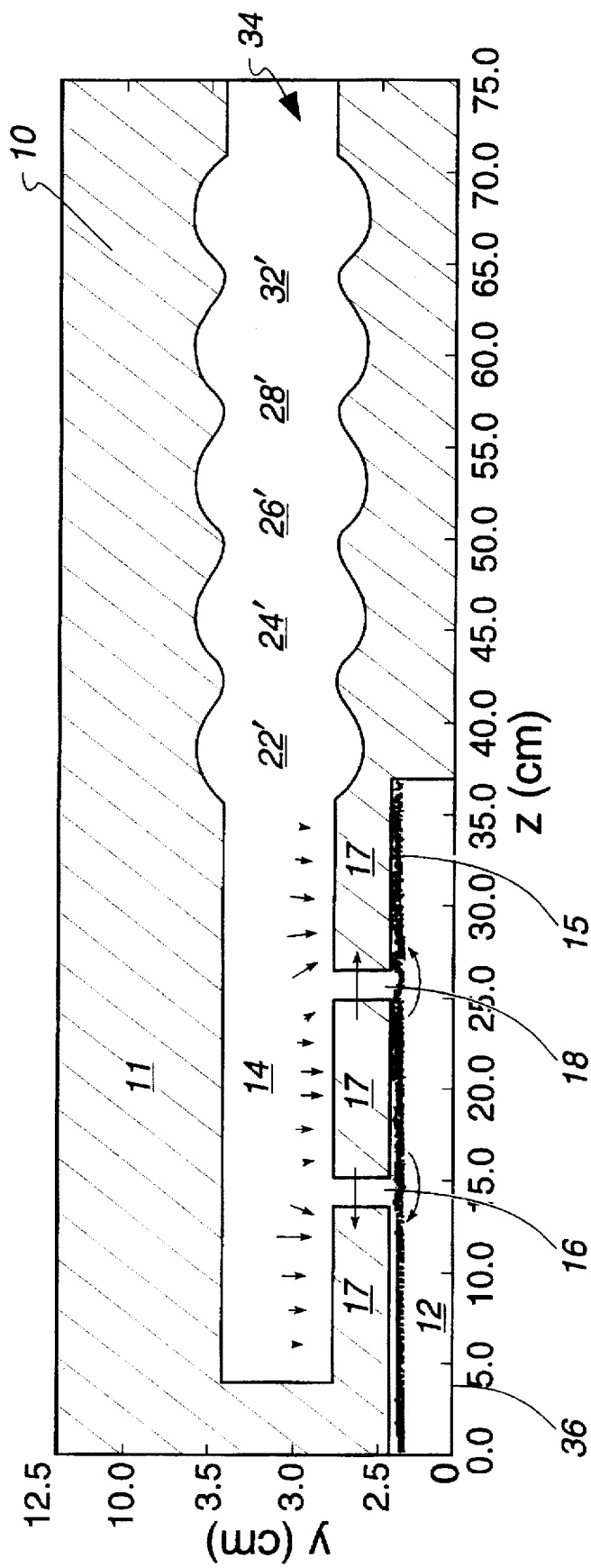
FIG. 1B depicts a DMO configuration used for simulating DMO performance according to the present invention using Bragg reflector elements.

In accordance with the present invention, a microwave oscillator known as a discrete monotron oscillator (DMO) is provided, as exemplified in FIGS. 1A and 1B. DMO structure 10 defines electron beam drift tube 12 and rf cavity 14 with outer conductor 11 and inner conductor 17 to form a half-wavelength resonant coaxial microwave cavity 14 operating in a fundamental TEM mode. FIGS. 1A and 1B depict the electric field pattern for a TEM mode. Modulating gap 16 and extraction gap 18 are located in inner conductor 17. Gaps 16 and 18 allow the electromagnetic field in cavity 14 to interact with electron beam 15 in electron beam drift tube 12 to accelerate and decelerate electron beam 15, respectively. Downstream (relative to electron beam input) of electron beam tube 12, cavity 14 is a half-wavelength long, with the downstream wall defined by frequency selective reflector sections 22–32, e.g., quarter wave dielectric plates or a Bragg reflector, which provide the correct cavity Q (on the order of 10) for the electrical fields to build up.

It will be understood that a complete DMO is formed as a figure of rotation of structure 10 about the z-axis 36. Electron beam 15 is generated by a conventional accelerator and is directed from left to right in the structure shown in FIGS. 1A and 1B. The resulting cylindrical cavity structures are conventionally supported by structures (not shown) that are well known to persons of ordinary skill in this art. FIG. 1 depicts exemplary radius dimensions y and axial length dimensions z that are used in the simulations shown in FIGS. 2A–2E and 3.

The DMO is basically a single resonant cavity 14 that has two gaps 16, 18. As a mildly relativistic beam, e.g., beam 15, passes modulating gap 16, its velocity is modulated, i.e., the beam is bunched by interaction with the rf field in gap 16. Power is extracted by the rf field from beam 15 at extraction gap 18. In an embodiment used for the simulation below, gaps 16, 18 are a quarter wavelength apart and located symmetrically with respect to cavity 14, i.e., each gap is located the same distance from a respective end wall of cavity 14. Again for purposes of the simulation herein, gaps 16 and 18 are the same width. The gap locations, width, and spacing as used herein are exemplary and are not intended to be limiting.

The direction of the electric field in gap 16 is reversed from the direction of the electric field in gap 18. Thus, the electron bunch formed from the velocity modulation imposed by gap 16 is decelerated in gap 18 and net power is extracted. Cavity 14 outputs microwave energy to frequency selective reflector sections 22–32, which may be comprised of coaxial quarter-wave sections, as shown in FIG. 1A. Frequency selective reflector sections 22–32 may also be comprised of a conventional Bragg reflector formed by rippled waveguide walls along sections 22'–32', as shown in FIG. 1B, where the ripples define a wavenumber at a multiple of the wavenumber of the frequency that is to be reflected for oscillation. The reflector sections 22–32 maintain a relatively higher cavity-Q for the desired mode. Undesired higher-order modes are heavily loaded by the reflector sections 22–32 and dissipate quickly. Microwave power is output through waveguide outlet 34.

For high rf power, the preferred electron beam 15 configuration is annular near the wall of drift tube 12, as shown in FIG. 2, but an axial electron beam could be provided for particular applications. An annular electron beam can be formed in a variety of devices that are not part of the present invention; see, e.g., U.S. Pat. No. 4,825,441, incorporated herein by reference. The spacing of the annular electron beam from the wall of drift tube 12 is not critical, but a relatively small spacing is preferred for high power buildup. Because an annular beam 15 propagates in drift tube 12 with gaps 16, 18 instead of a large diameter cavity, very little of the beam's kinetic energy is lost to the beam's potential energy requirements. In addition, the small size (about a half-wavelength length and no constraint on diameter) and simple design (single cavity) of the DMO lead to a low construction costs.

In one embodiment, electron beam 15 takes a quarter period to travel from modulating gap 16 to extraction gap 18. Thus, an electron bunch formed by modulating gap 16 is phased correctly for deceleration in extraction gap 18. The enclosed beam pipe reduces significantly the beam's potential energy requirements, and efficiencies similar to relativistic klystrons are possible. The coaxial cavity 14 provides rf field feedback between gaps 16, 18, and oscillations turn on smoothly and are narrow band.

An analysis was performed to derive the small-signal gain, calculate the energy balance (and device efficiency) at saturation, and find the coax-cavity Q as a function of the quarter-wave sections' number and dielectric constant. The performance of the DMO was then simulated using the particle-in-cell code ISIS (G. Gisler et al., "ISIS: a new code for PIC plasma simulations," 29 Bull. Amer. Phys. Soc. 1208 (1984)), including device gain and saturation, which are in reasonable agreement with the analysis. Gap voltage and output power as a function of the cavity Q were determined.

In order to calculate the small signal gain, the electromagnetic fields in cavity 14 are related to the power given up by the beam minus the power lost to the output waveguide. The instantaneous beam power converted to rf power is given by the volume integral of $\vec{J} \cdot \vec{E}$, where $\vec{J}$ is the beam current density and $\vec{E}$ is the rf electric field. There is nonzero time-averaged power absorbed only if there is a harmonic component to the beam current. The small-signal space-charge bunching equation for the fundamental current $I_1$ at extraction gap 18 resulting from the voltage at modulating gap 16 is given by $$I_1 = I_0 \frac{eV_{gap}M}{m_0c^2\beta\gamma^3\alpha\mu} \sin\frac{d\omega\delta\alpha\mu}{\beta c} \qquad \text{Eqn. (1)}$$

where e and $m_0$ are the electronic charge and mass, respectively, $I_0$ is the average beam current, $V_{gap}$ is the gap voltage (assume gap voltages are equal), $\beta$ and $\gamma$ are the conventional relativistic factors, M is the transit time factor (close to unity), d is the intergap spacing c is the speed of light, and ω is the cavity frequency. The space-charge parameters δ, α, and μ are given by $$\alpha = \frac{I_o}{I_s \beta \gamma^3} ,\qquad \text{Eqn. (2)}$$

$$\alpha\mu = \left( \alpha^2 + \frac{\alpha}{\gamma^2} \right)^{\frac{1}{2}} \beta, \qquad \text{Eqn. (3)}$$

and $$\delta = \frac{\beta^2}{\beta^2 - \alpha} ,\qquad \text{Eqn. (4)}$$

where the normalized threshold current $I_s$ is defined in terms of the beam radius $r_b$ and beam pipe radius $r_w$ by $$I_s = \frac{2\pi\epsilon m_o c^3}{e \log \frac{r_w}{r_b}} \qquad \text{Eqn. (5)}$$

where ε is the permittivity of the gap and e is the charge on an electron

For synchronism, the intergap spacing is selected so that the beam requires a quarter rf period to travel from the modulating gap to the extraction gap. The factor δαμ is typically much less than unity. The energy balance in the cavity is determined by the power removed from the beam and the power flowing out of the cavity. If cavity losses arise from an outgoing waveguide, the rate of change of the stored cavity energy, $E_s$, is given by $$\frac{dE_s}{dt} = \frac{1}{2} V_{gap} I_1 M - \frac{V_{gap}^2}{2Q\frac{R}{Q}} ,\qquad \text{Eqn. (6)}$$

where, Q is the cavity's Q and the ratio R/Q is a purely geometric factor given by $$\frac{R}{Q} = \frac{(\int \vec{E}(r) \cdot \vec{dl})^2}{\omega \epsilon \int |E|^2 dV} ,\qquad \text{Eqn. (7)}$$

where $\vec{E}$ is the electric field vector, dV is a differential volume containing $\vec{E}$, and the line integral is along the $\vec{X}$ differential path $\vec{dl}$ the electrons take traversing the gap fields. The expression for the gap voltage becomes $$\frac{dV_{gap}}{dt} = V_{gap}\frac{\pi^2 \omega}{4} H, \qquad \text{Eqn. (8)}$$

or $$V_{gap} = V_o e^{\omega \pi^2 H t/4}, \qquad \text{Eqn. (9)}$$

where the normalized growth rate is given by $$H = \frac{\delta e M^2 \pi I_o}{2 m_o c^2 \beta \gamma^3} \cdot \frac{R}{Q} - \frac{1}{Q} .\qquad \text{Eqn. (10)}$$

For oscillations to build up, the cavity Q times the average beam current must exceed $$QI_o \geq \frac{2 m_o c^2 \beta \gamma}{\delta e M^2 \pi} \left(\frac{R}{Q}\right)^{-1} ,\qquad \text{Eqn. (11)}$$

or $$QI_o \geq \left(\frac{R}{Q}\right)^{-1} \frac{0.324 MV}{\delta M^2} .\qquad \text{Eqn. (12)}$$

At saturation, the bunching is primarily ballistic, and, if electrons are not reflected in the extraction gap, it is given by $$I_1 = 2I_o J_1\left(\frac{MV_{gap} e \omega d}{m_o c^3 \beta^3 \gamma^3}\right) .\qquad \text{Eqn. (13)}$$

Saturation is reached when the power given up by the beam equals the power escaping through the output waveguide, and the gap voltage is given by $$\frac{V_{gap}^2}{2Q\frac{R}{Q}} = \frac{I_1 V_{gap}}{2} .\qquad \text{Eqn. (14)}$$

The efficiency of beam-to-microwave power conversion is then given by $$\eta = \frac{I_1^2}{2I_o V_{beam}} Q \frac{R}{Q} .\qquad \text{Eqn. (15)}$$

Note that if the cavity Q is too high, the fundamental current will decrease because the gap voltage cannot exceed the beam voltage significantly. This physically happens by returning electrons out of phase with the electrons in the output gap. The lowered harmonic current is given by Eqn. (14) with the gap voltage set equal to the beam voltage. The proper harmonic current to use in Eqn. (15) is given by Eqn. (13) for gap voltages up to the beam voltage, $V_{beam}$. The conversion efficiency for a DMO with extremely large cavity-Q is given by $$\eta = \frac{V_{beam}}{2I_o Q \frac{R}{Q}} .\qquad \text{Eqn. (16)}$$

The power lost from the fundamental mode through the stack forming frequency selective reflector sections 22–32, formed as quarter-wave sections is easily found by either direct calculation of the reflected waves or by transmission line theory. The cavity Q for a dielectric plate reflector is given by $$Q = \frac{\pi}{4} \cdot \frac{((\epsilon_2/\epsilon_1)^n + 1)^2}{(\epsilon_2/\epsilon_1)^n} ,\qquad \text{Eqn. (17)}$$

where $\epsilon_i$ is the dielectric constant for material i where i=1 or 2, and n is the number of pairs of dielectric plates. The quarter-wave sections can be formed also by changing the coax-waveguide conductor radii for high-power operation. A Bragg reflector is preferred for high power operation.

Figure 2A:
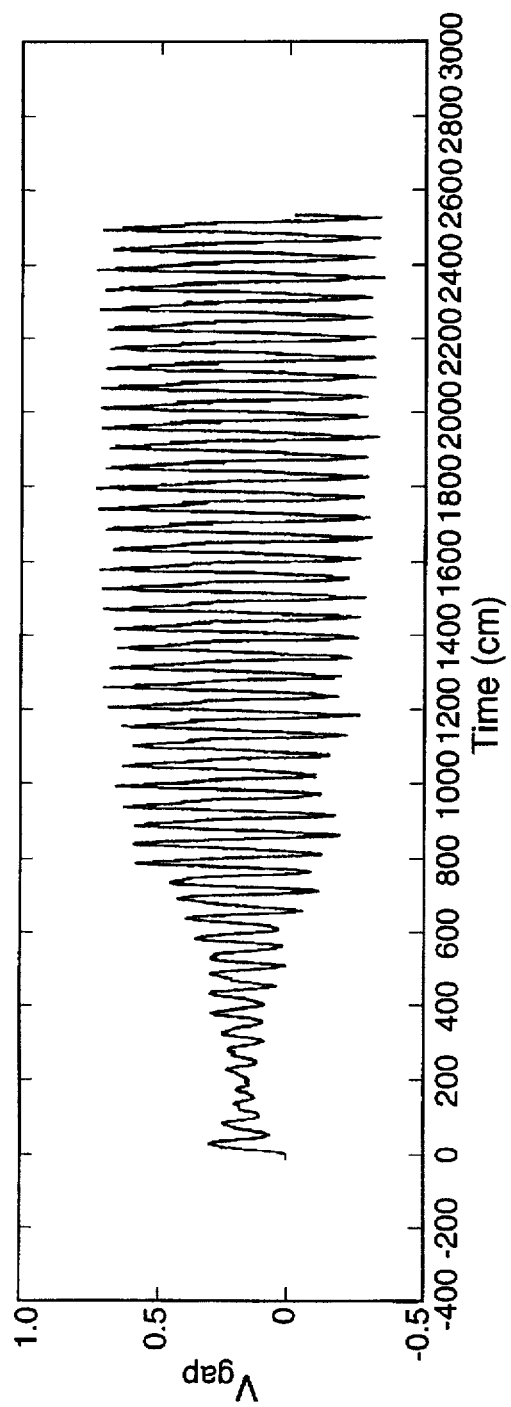
FIG. 2A graphically depicts a modulating gap voltage versus time for the configuration shown in FIG. 1.
Figure 2B:
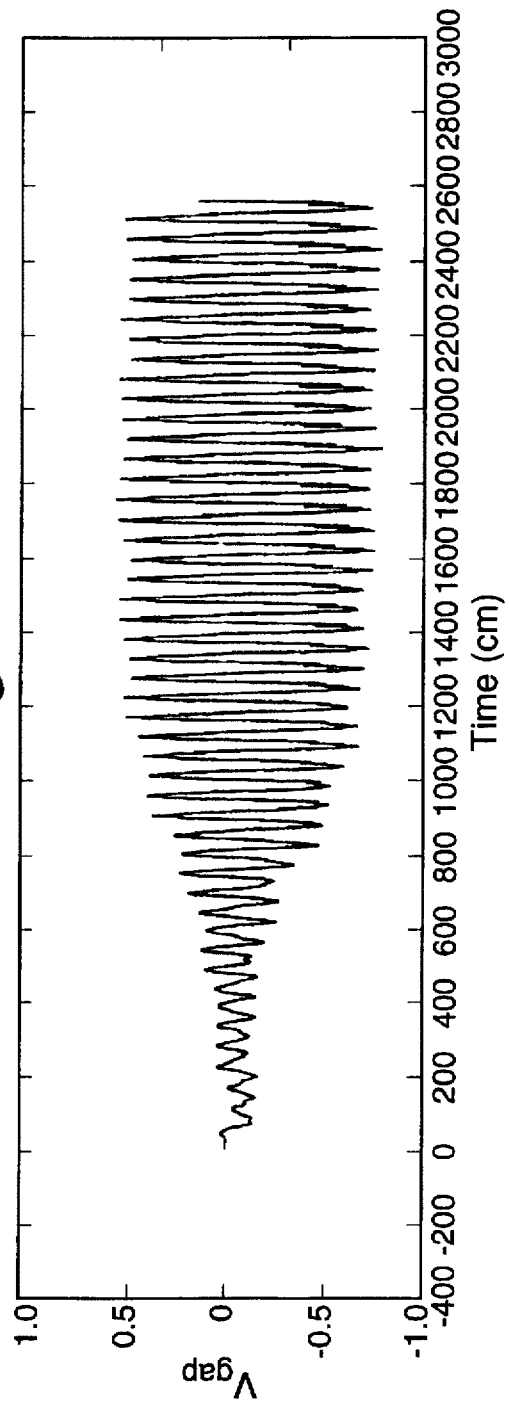
FIG. 2B graphically depicts an extraction gap voltage versus time for the configuration shown in FIG. 1.
Figure 2C:
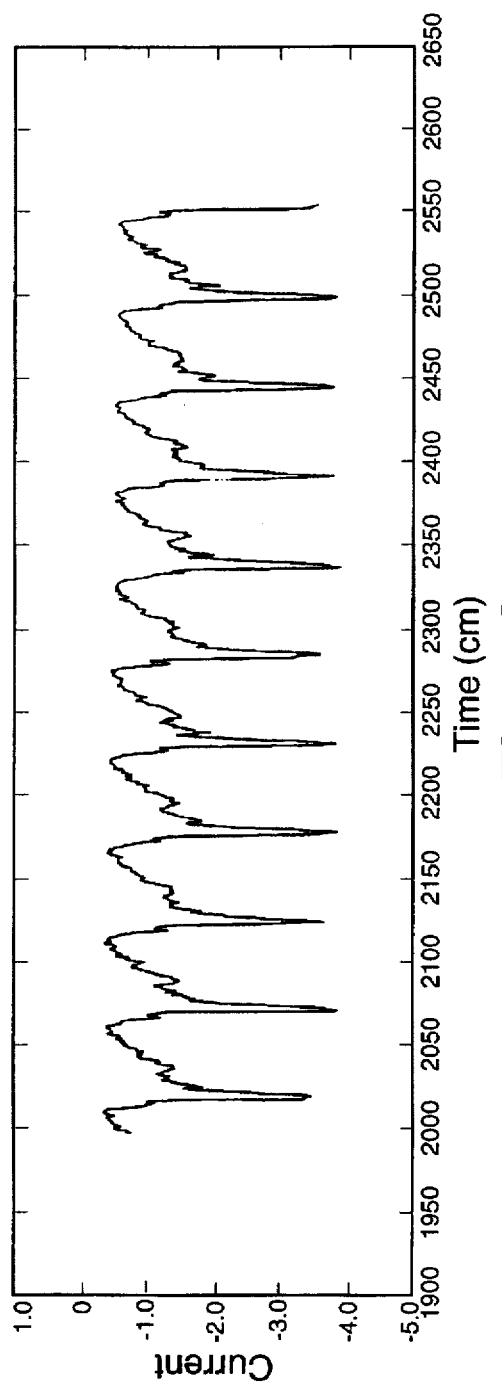
FIG. 2C graphically depicts a current profile at the extraction gap for the configuration shown in FIG. 1.
Figure 2D:
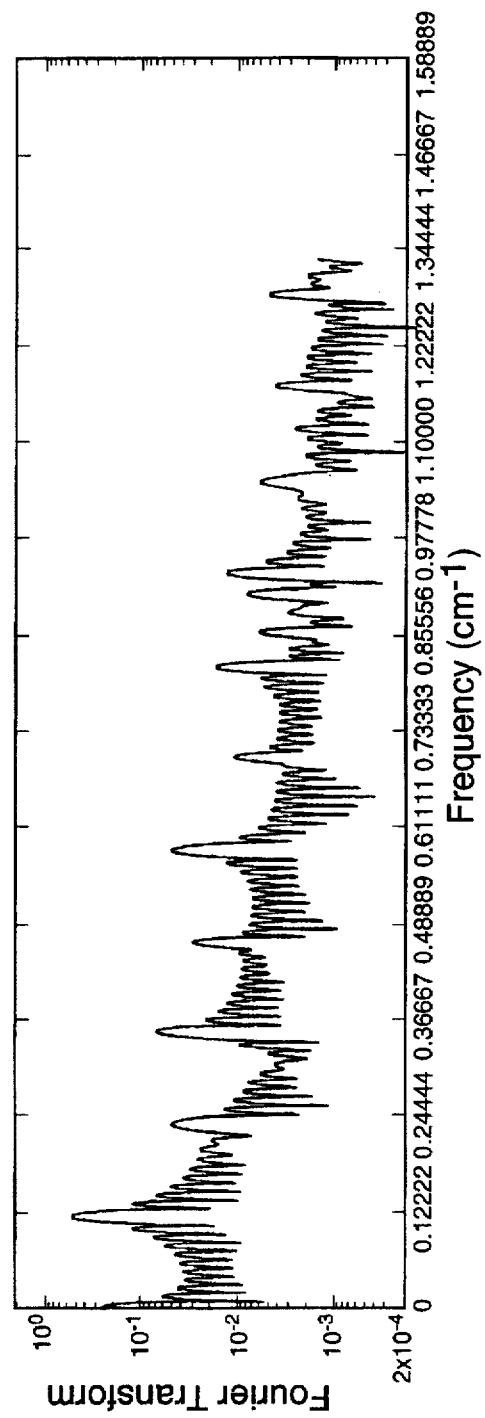
FIG. 2D graphically depicts a Fourier transform of the steady-state voltage at the extraction gap for the configuration shown in FIG. 1.
Figure 2E:
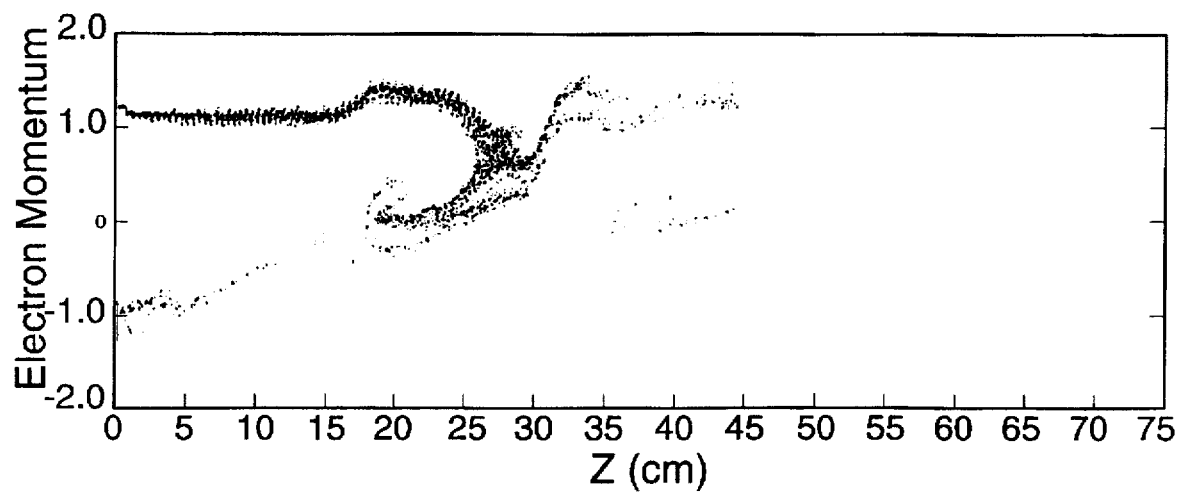
FIG. 2E graphically depicts a phase-space plot of the electrons at an instant of time for the configuration shown in FIG. 1.

FIGS. 2A and 2B depict a simulation of the monotron according to the present invention using ISIS, with a 300 keV, 2 kA electron beam and a 550 MHz cavity. FIGS. 2A and 2B show the modulating and extraction gap voltages, respectively, as a function of time. The saturation time is less than 50 nsec. FIG. 2C depicts the current profile at the extraction gap, with about 60% harmonic current. The Fourier transform of the extraction gap voltage over the last 50 nsec in the simulation is plotted in FIG. 2D, showing good mode purity. Finally, in FIG. 2E, the momentum profile of the electrons is plotted at an instant of time. The formation of the bunch at the modulating gap (i.e., at about 15 cm) is clear, as is extraction at the output gap (i.e., at about 25 cm). The average output power in the fundamental mode is about 110 MW, or about 20% beam-to-microwave conversion efficiency.

Figure 3:
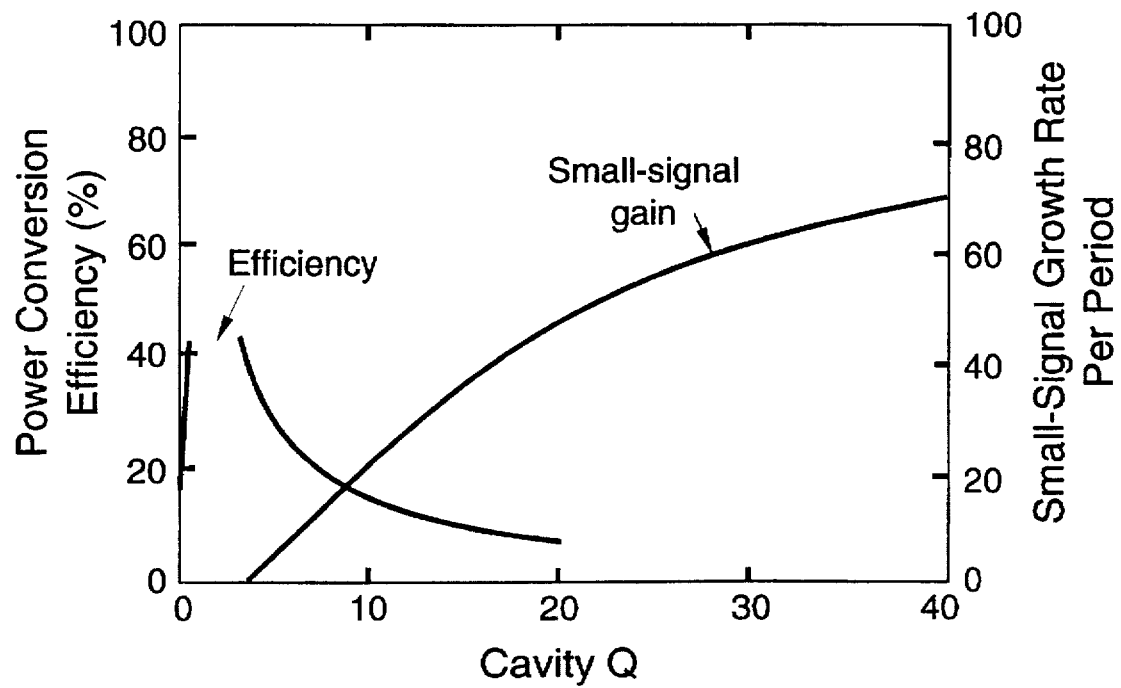
FIG. 3 graphically depicts small-signal growth rate and beam-to-microwave power conversion efficiency versus cavity Q.

FIG. 3 graphically depicts the small-signal growth rate as a function of Q, with the results of simulations and small-signal theory lying substantially along the same curve. The beam-to-microwave conversion efficiency from simulations is also shown as a function of Q. The calculated efficiencies are calculated from Eqns. (13) and (15) for low Q and Eqn. (16) for large Q. The simulations were done with symmetrical gaps and show high efficiency, but at the expense of gain. By making the modulating gap longer than the extraction gap, however, the efficiency can be increased without depressing the gain.

Thus, the DMO is a simple oscillator, capable of high power and relatively high beam-to-rf power conversion efficiency. The device turns on stably, has high gain (typically greater than unity), and power can easily be extracted in a useful mode. Some limited rf amplitude control can be obtained by varying the electron beam current and voltage.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A microwave oscillator comprising:

a cylindrical outer conductor;

a cylindrical inner conductor concentric with and within said outer conductor, where said outer conductor and said inner conductor define a half-wavelength resonant coaxial microwave cavity therebetween operating in fundamental TEM mode for microwave oscillation, said inner conductor further defining a drift tube space therein for propagating an electron beam input thereto;

said inner conductor defining a modulating gap and an extraction gap, said extraction gap being electrically spaced one quarter wavelength downstream of said modulating gap, said modulating gap and said extraction gap each connecting said coaxial microwave cavity with said drift tube wherein energy for said microwave oscillation is extracted from said electron beam at said extraction gap and said microwave oscillation modulates said electron beam at said modulating gap.

2. A microwave oscillator according to claim 1, wherein said modulating gap and said extraction gap are axially symmetrically located relative to end walls of said half-wavelength resonant coaxial microwave cavity.

3. A microwave oscillator according to claim 2, wherein said modulating gap and said extraction gap have equal widths.

4. A microwave oscillator according to claim 1, wherein said modulating gap and said extraction gap have equal widths.

5. A microwave oscillator according to any one of claims 1, 2, and 4, further including a microwave output waveguide connected to said half-wavelength coaxial cavity where said microwave output waveguide includes a frequency selective reflector for attenuating undesired propagation modes.

6. A microwave oscillator according to claim 5, where said frequency selective reflector is at least one quarter-wavelength section.

7. A microwave oscillator according to claim 5, where said frequency selective reflector is a Bragg reflector.

* * * * *